(12) United States Patent
Sasagawa

(10) Patent No.: US 8,975,177 B2
(45) Date of Patent: Mar. 10, 2015

(54) LASER RESIST REMOVAL FOR INTEGRATED CIRCUIT (IC) PACKAGING

(71) Applicant: Intel Corporation, Santa Clara, CA (US)

(72) Inventor: Motohiko Sasagawa, Tsukuba (JP)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/804,592

(22) Filed: Mar. 14, 2013

(65) Prior Publication Data

US 2014/0273431 A1    Sep. 18, 2014

(51) Int. Cl.
| | | |
|---|---|---|
| H01L 21/44 | (2006.01) | |
| B23K 26/16 | (2006.01) | |
| H01L 21/768 | (2006.01) | |
| H01L 23/00 | (2006.01) | |

(52) U.S. Cl.
CPC .............. *B23K 26/16* (2013.01); *H01L 21/768* (2013.01); *H01L 24/80* (2013.01)
USPC ..................... 438/614; 257/737; 257/E21.508

(58) Field of Classification Search
CPC ........... H01L 2924/15311; H01L 2224/73204; H01L 24/13; H01L 24/05; H01L 23/49816; H01L 24/81
USPC ............ 257/737, E23.179, E21.508; 438/614
See application file for complete search history.

(56) References Cited

U.S. PATENT DOCUMENTS

| | | | | |
|---|---|---|---|---|
| 4,448,636 | A * | 5/1984 | Baber ........................... | 438/670 |
| 5,597,590 | A * | 1/1997 | Tanimoto et al. .......... | 425/174.4 |
| 2001/0002728 | A1 * | 6/2001 | Tsukada et al. ............... | 257/693 |
| 2002/0173134 | A1 * | 11/2002 | Viswanadam et al. ........ | 438/613 |
| 2005/0070084 | A1 * | 3/2005 | Hsu et al. ....................... | 438/612 |
| 2005/0242442 | A1 * | 11/2005 | Greco et al. ................... | 257/762 |
| 2006/0244140 | A1 * | 11/2006 | Hu ................................. | 257/737 |
| 2007/0155054 | A1 | 7/2007 | Hsu | |
| 2007/0155154 | A1 * | 7/2007 | Pang et al. ..................... | 438/613 |
| 2007/0275503 | A1 * | 11/2007 | Lin et al. ........................ | 438/106 |
| 2007/0281247 | A1 * | 12/2007 | Phillips et al. ................. | 430/311 |
| 2008/0194079 | A1 * | 8/2008 | Yamamoto et al. ........... | 438/462 |
| 2009/0007933 | A1 * | 1/2009 | Thomas et al. .................... | 134/1 |
| 2010/0084763 | A1 * | 4/2010 | Yu ................................... | 257/737 |
| 2011/0132443 | A1 * | 6/2011 | Schultz-Wittman et al. . | 136/252 |
| 2012/0104625 | A1 * | 5/2012 | Park et al. ...................... | 257/774 |
| 2012/0184099 | A1 * | 7/2012 | Souter ............................ | 438/669 |
| 2014/0264951 | A1 | 9/2014 | Faruqui et al. | |

* cited by examiner

*Primary Examiner* — Steven J Fulk
(74) *Attorney, Agent, or Firm* — Schwabe, Williamson & Wyatt, PC

(57) ABSTRACT

Embodiments of the present disclosure are directed to laser removal of resist material from integrated circuit (IC) packaging components, as well as package assemblies and systems incorporating such material and removal methods. A resist layer may be applied to one or more components of a package assembly. The resist layer may be subsequently removed by applying laser radiation and a flow of fluid to the resist layer. The laser radiation may cause cracking, delamination, and/or polymer chain scission, and the flow of fluid may enhance mechanical separation of the resist material from the package assembly components.

21 Claims, 6 Drawing Sheets

LASER RESIST REMOVAL FOR INTEGRATED CIRCUIT (IC) PACKAGING

FIELD

Embodiments of the present disclosure generally relate to the field of integrated circuits, and more particularly, to techniques and configurations for laser resist removal from integrated circuit (IC) package components.

BACKGROUND

Flip chips are frequently used in mobile devices due to their relatively small dimensions. Wafer-level packaging (WLP) may allow opportunities for further reductions in package dimensions with improved performance. Both packaging technologies involve the formation of microbumps on a die or wafer. In conventional process flows for such packages, a patterned photoresist is often used to form the microbumps. The photoresist is subsequently removed by wet chemical processes.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
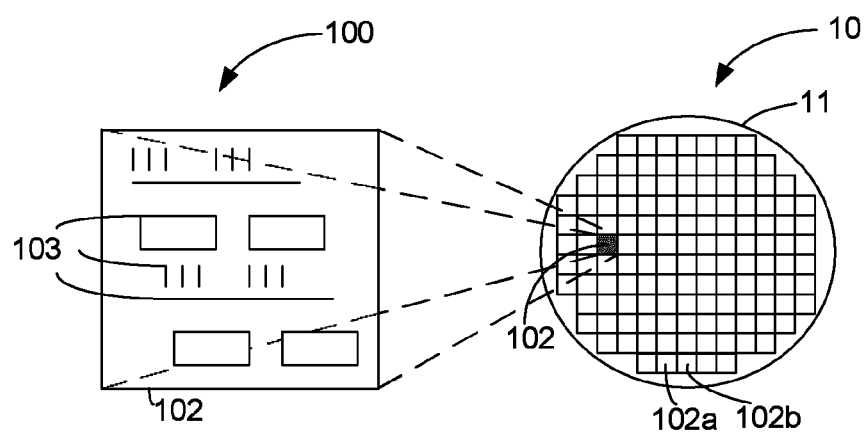
FIG. 1 schematically illustrates an example top view of a die in wafer form and in singulated form, in accordance with some embodiments.

Embodiments of the present disclosure describe techniques and configurations for removal of a resist layer from die/package assembly surfaces. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout unless otherwise indicated, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first feature formed, deposited, or otherwise disposed on a second feature," may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

FIG. 1 schematically illustrates an example top view of an integrated circuit (IC) die (hereinafter "die 102") in wafer form 10 and in singulated form 100, in accordance with some embodiments. In some embodiments, the die 102 may be one of a plurality of dies (e.g., dies 102, 102a, 102b) of a wafer 11. The wafer 11 may include a semiconductor substrate composed of a semiconductor material such as, for example, silicon (Si) or other suitable semiconductor material. Individual dies may include circuitry 103 formed on a surface of the wafer 11. The circuitry 103 may include, for example, an active layer (e.g., active layer 203 of FIGS. 4-7) coupled with one or more electrical routing features (e.g., electrical routing features 206 of FIG. 4) as described herein. Each of the dies (e.g., dies 102, 102a, 102b) may be a repeating unit of a semiconductor product that includes electrical routing features (e.g., electrical routing features 206 of FIGS. 4-7). In various embodiments, some or all of the dies (e.g., dies 102, 102a, 102b of FIG. 1) may have an outer layer of underfill material (e.g., underfill layer 226 of FIGS. 4-7), and the electrical routing features may be embedded in the underfill layer, as described herein. The dies may comport with embodiments described, for example, in connection with FIGS. 2 and 4-7.

After a fabrication process of the semiconductor product is complete, the wafer 11 may undergo a singulation process in which each of the dies (e.g., die 102) is separated from one another to provide discrete "chips" of the semiconductor product. The wafer 11 may be any of a variety of sizes. In some embodiments, the wafer 11 has a diameter ranging from about 25.4 mm to about 450 mm. The wafer 11 may include other sizes and/or other shapes in other embodiments. According to various embodiments, a die as described herein may be one of a plurality of dies in wafer form 10 or may be in singulated form 100, depending on whether the wafer 11 has been singulated. For example, in some embodiments, die 102 and dies 102a and 102b may be singulated dies. In other embodiments die 102 may be in wafer form.

In various embodiments, an underfill layer (e.g., underfill layer 226 of FIG. 4) may be added to the wafer 11 before singulation of the dies. In other embodiments, an underfill layer may be added to the wafer 11 after singulation of the dies. For example, an underfill layer may be added to the wafer 11 after cutting through the semiconductor substrate between the dies, but before severing an adhesive layer and mechanically separating the dies. In some embodiments, an underfill layer may be added to a die (e.g., die 102) after the die is singulated.

Figure 2:
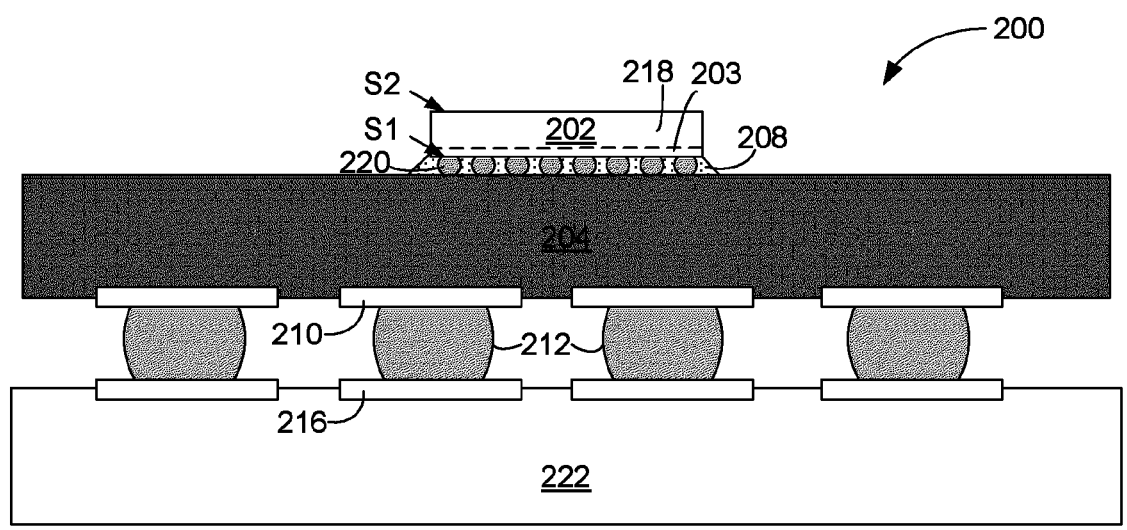
FIG. 2 illustrates a cross-section side view of an example integrated circuit (IC) package assembly, in accordance with various embodiments.

FIG. 2 schematically illustrates a cross-section side view of an example package assembly 200 including a die 202, a package substrate 204, and a circuit board 222.

In some embodiments, as described above, die 202 may have a first side S1 and a second side S2. First side S1 may have an active layer 203 with one or more transistors/circuits formed thereon. Electrical routing features 206, shown for example in FIGS. 4-7, may be arranged on first side S1. Second side S2 may include a semiconductor substrate 218 composed of a semiconductor material. The semiconductor substrate 218 may be composed of n-type or p-type material systems and may include, for example, a crystalline substrate formed using a bulk silicon or a silicon-on-insulator substructure. In some embodiments, the semiconductor substrate 218 may be formed using alternate materials, which may or may not be combined with silicon, that include but are not limited to germanium, indium antimonide, lead telluride, indium arsenide, indium phosphide, gallium arsenide, or gallium antimonide. Other group II-VI, III-V or group IV material systems may also be used to form the semiconductor substrate 218 according to various embodiments. In some embodiments, second side S2 may also include one or more electrical routing features, such as additional circuitry, through-silicon vias (TSVs), and/or TSV pads (not shown).

In various embodiments, die 202 may be a processor core with transistors and other components that together may form all or part of the "brain" of a computing device in which package assembly 200 is installed. In various embodiments, die 202 may be a primary logic die. In other embodiments, die 202 may be configured to function as memory, an application specific circuit (ASIC), a processor, or some combination thereof.

In various embodiments, die 202 may include two or more dies, either in wafer form (e.g., wafer form 10 or portion thereof) or singulated (e.g., stacked front-to-back, front-to-front, back-to-back, side-by-side, or embedded in a common substrate). For example, die 202 may include a primary logic die and a secondary logic die (e.g., another processor core) configured to supplement the processing power of the primary logic die. As another example, die 202 may include two or more dies that collectively provide a processor core and memory. In various other embodiments, die 202 may be, or may include, any type of die configured to simplify a system/platform into which package assembly 200 is installed, such as a memory die or a power management die.

In some embodiments, die 202 may be embedded in an encapsulant, such as (but not limited to) an Ajinomoto Build-up Film (ABF) substrate, other dielectric/organic materials, resins, epoxies, polymer adhesives, silicones, acrylics, polyimides, cyanate esters, thermoplastics, and/or thermosets. In various embodiments, the package assembly 200 may include, for example, combinations of flip-chip and wire-bonding techniques, interposers, multi-chip package configurations including system-on-chip (SoC) and/or package-on-package (PoP) configurations to route electrical signals.

One or more electrical routing features 210 may be disposed on a surface of package substrate 204. In various embodiments, electrical routing features 210 may include a ball grid array ("BGA") or other electrical components that may route electrical signals to/from die 202, circuit board 222, or to other components to which package assembly 200 is attached.

In various embodiments, die 202 may be coupled to package substrate 204 by die interconnects 220 and/or by an interface layer 208. In various embodiments, die interconnects 220 may be solder bumps, copper pillars, or other electrically conductive features. Interface layer 208 may be, or may include, a layer of underfill, adhesive, metal, dielectric, or other such material. Interface layer 208 may serve various functions, such as providing mechanical strength, conductivity, heat dissipation, or adhesion.

In some embodiments, package substrate 204 may be a coreless substrate. For example, package substrate 204 may be a bumpless build-up layer (BBUL) assembly that includes a plurality of "bumpless" build-up layers. As used herein, "bumpless build-up layers" may refer to layers of substrate and components embedded therein without the use of solder or other attaching means that may be considered "bumps." In various embodiments, one or more build-up layers described herein may have material properties that may be altered and/or optimized for reliability, warpage reduction, and so forth. In other embodiments, package substrate 204 may be composed of a polymer, ceramic, glass, or semiconductor material. In some embodiments, package substrate 204 may be a conventional cored substrate and/or an interposer.

In some embodiments, circuit board 222 may be a printed circuit board (PCB) composed of an electrically insulative material such as an epoxy laminate. For example, the circuit board 222 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Structures (not shown) such as traces, trenches, vias may be formed through the electrically insulating layers to route the electrical signals of the die 202 through the circuit board 222. The circuit board 222 may be composed of other suitable materials in other embodiments.

Only a portion of the circuit board 222 may be depicted in FIG. 2. In various embodiments, the circuit board 222 may include other electrical devices coupled to the circuit board that are configured to route electrical signals to or from the die 202 through the circuit board 222. In some embodiments, the circuit board 222 may be a motherboard (e.g., motherboard 802 of FIG. 8).

A first side of package substrate 204 may be coupled to first surface S1 of die 202 by die interconnects 220 and/or electrical routing features 206. A second opposite side of package substrate 204 may be coupled to circuit board 222 by package interconnects 212. Package interconnects 212 may couple electrical routing features 210 disposed on the second side of package substrate 204 to corresponding electrical routing features 216 on circuit board 222. Package substrate 204 may have electrical routing features formed therein to route electrical signals between the die 202, circuit board 222, and/or other electrical components external to the IC package assembly 200. Package interconnects 212 and die interconnects 220 may include any of a wide variety of suitable structures and/or materials including, for example, bumps, pillars or balls formed using metals, alloys, solderable material, or combinations thereof. In various embodiments, electrical routing features 210 may be arranged in a ball grid array or other configuration.

Figure 3:
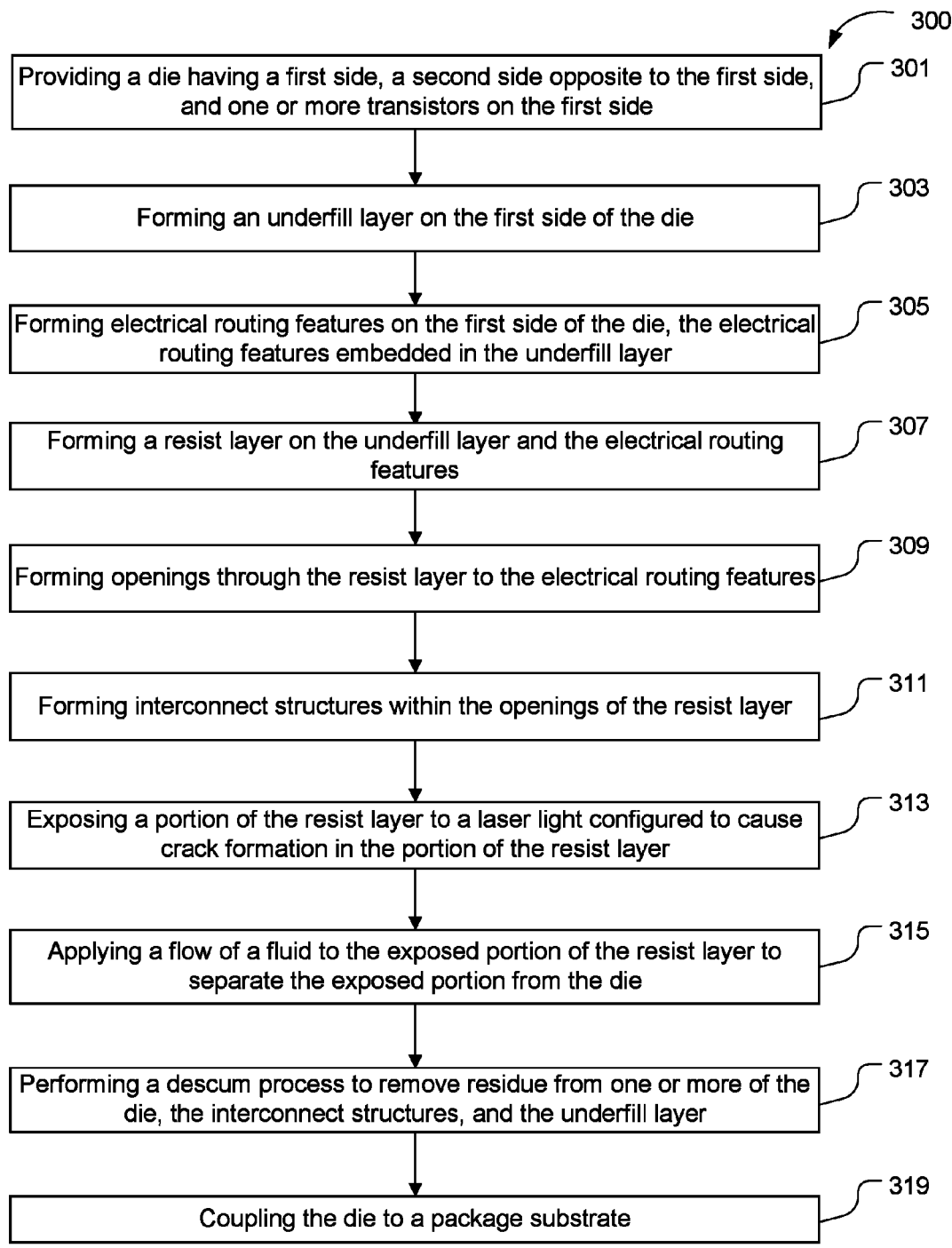
FIG. 3 schematically illustrates a flow diagram for a method of fabricating a package assembly, in accordance with some embodiments.

FIG. 3 schematically illustrates a flow diagram for a method of fabricating a package assembly, in accordance with some embodiments. FIGS. 4-7 depict examples of example package assembly 200 at various corresponding stages of fabrication. As such, portions of method 300 are further described with reference to FIGS. 4-7.

In the ensuing description, it is to be understood that references to a "die" (e.g., die 202) may mean a singulated die, more than one die, and/or one or more dies in wafer form. Therefore, in some embodiments, some or all of blocks 301-319 may be performed with a singulated die. In other embodiments, some or all of blocks 301-319 may be performed with a wafer having one or more dies described therein. In still other embodiments, some of blocks 301-319 may be performed on a wafer and others of blocks 301-319 may be performed with a die singulated from that wafer. For example, in one embodiment blocks 301-313 may be performed with a wafer, and blocks 315-319 may be performed on a die after singulation of the die from the wafer.

Current methodologies for removing resist materials (e.g., solder resist, photoresist) require the use of chemicals that may react with silicon or other IC package assembly components. In addition, current chemical methods for resist stripping require the purchase and subsequent disposal of hazardous/flammable materials. Embodiments described herein provide methods for dry (non-chemical) removal of resist materials from dies/wafers. In various embodiments, irradiation of resist material with laser energy may cause photochemical ablation/degradation of the resist material, allowing clean removal with reduced or no damage to other assembly package components.

Figure 4:
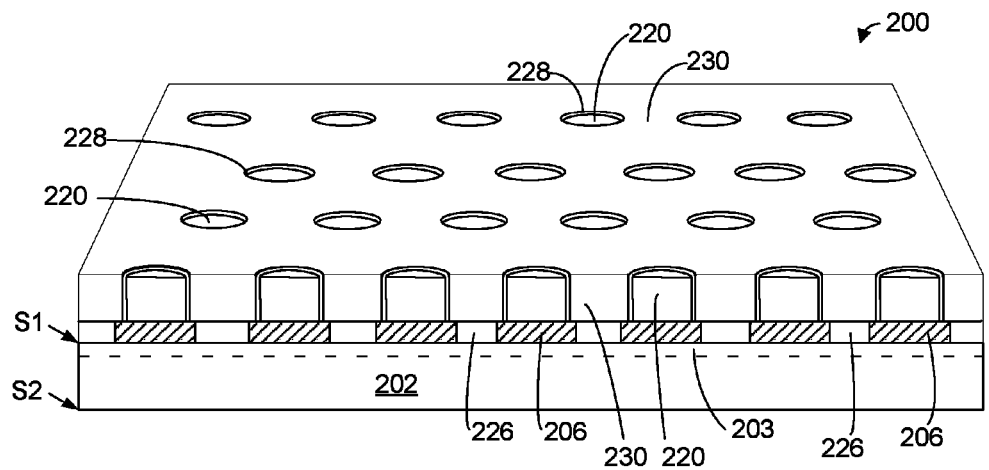
FIG. 4 schematically illustrates various stages of package assembly fabrication, in accordance with various embodiments.

Referring now to FIG. 3, at block 301, a die having a first side, a second side opposite to the first side, and one or more transistors on the first side may be provided. The die may be, for example, die 202 as described herein. FIG. 4 depicts a package assembly 200 with a die 202, in accordance with various embodiments.

At block 303, an underfill layer may be formed on the first side of the die (FIG. 4). As illustrated, die 202 may include a first ("front" or "active") side S1 and an opposite ("back" or "inactive") side S2. An underfill layer 226 may be coupled with the first side S1 of die 202 using any suitable technique. Example of such techniques include, but are not limited to, spin coating, liquid coating, and lamination. In some embodiments, underfill layer 226 may comprise a polymer matrix with one or more fillers dispersed therein. In other embodiments, underfill layer 226 may include one or more of organic polymers, silica filler particles and/or silica powder, and/or other filler particles. For example, in various embodiments, underfill layer 226 may include approximately 0.5-55%, by weight, of filler particles (e.g., silica particles). In other embodiments, underfill layer 226 may be an unfilled material, such as an unfilled polymer epoxy material. Examples of underfill materials include, but are not limited to, epoxy based-adhesive films, silica-filled epoxy resins, and epoxy-thermoplastic blends. In some embodiments, underfill layer 226 may comprise a reworkable underfill material. In other embodiments, underfill layer 226 may include one or more fillers such as boron nitride, aluminum nitride, or the like.

In some embodiments, underfill layer 226 may be disposed on, and in physical contact with, a portion of side S1. In other embodiments, a passivation layer (not shown) may be provided between die 202 and underfill layer 226. In addition, although not shown in the Figures, one or more other layers or materials may be formed on die 202, underfill layer 226, and/or electrical routing features 206. Examples of such layers/materials include, but are not limited to, one or more under bump metallization (UBM) materials (e.g., a copper seed layer, a layer of copper, layers of metals or semi-metals).

At block 305, one or more electrical routing features 206 may be formed on the first side of the die. In some embodiments, the electrical routing features 206 may be embedded in the underfill layer 226. In various embodiments, electrical routing features 206 may be coupled with the first side S1 of die 202, and underfill layer 226 may be disposed on/around electrical routing features 206 (FIG. 4). In some embodiments, electrical routing features 206 may be embedded within underfill layer 226 and subsequently exposed using any suitable technique (e.g., by planarizing, wet or dry polishing, wiping/polishing with solvent, grinding, plasma etching, wet/dry abrading, laser drilling, etc.). In other embodiments, underfill layer 226 may be applied to the first side S1 of die 202 and may flow around electrical routing features 206 (e.g., by capillary action) without covering the upper surfaces of electrical routing features 206.

In other embodiments, underfill layer 226 may be formed on first side S1 of die 202 prior to forming electrical routing features 206 in/on underfill layer 226. For example, in some embodiments, underfill layer 226 may be formed on die 202, openings may be formed in underfill layer 226 (e.g., by laser drilling), and electrical routing features 206 may be formed in the openings. Electrical routing features 206 may be formed by any suitable technique, such as by electroless/electrolytic plating of one or more metals (e.g., copper, gold, tin, etc.) into the openings and/or deposition of conductive pastes (e.g., copper paste) onto underfill layer 226 or into openings therein. In some embodiments, electrical routing features 206 may be bond pads. In other embodiments, electrical routing features 206 may be bumps, pillars, or other structures (e.g., copper bumps/pillars). In a particular embodiment, electrical routing features may be, or may include, copper microbumps/pillars at least partially embedded within underfill layer 226.

At block 307, a resist layer may be formed on the underfill layer and the electrical routing features. FIG. 4 depicts a resist layer 230 disposed on underfill layer 226 and electrical routing features 206. In various embodiments, resist layer 230 may be, or may include, a polymer matrix. Examples of suitable materials for resist layer 230 may include, but are not limited to, negative photoresists, positive photoresists, dry film resists, photosensitive polymide, and solder resists. In various embodiments, resist layer 230 may be applied to die 202 using conventional methods. Example of such methods include, but are not limited to, spin coating, liquid coating, and lamination.

In some embodiments, resist layer 230 may be a layer of spun-on negative photoresist. In other embodiments, resist layer 230 may be a layer of laminated negative photoresist. In still other embodiments, resist layer 230 may be a layer of positive photoresist. In various embodiments, resist layer 230 may have a thickness in the range of 5-15 µm, 10-20 µm, 20-30 µm, 25-75 µm, 50-100 µm, 75-150 µm, 100-200 µm, 50-250 µm, or 100-300 µm.

In various embodiments, resist layer 230 may be photocurable and/or heat-curable. For example, in some embodiments resist layer 230 may include a resin, adhesive, and/or polymer matrix that is UV-curable (e.g., exhibits cross-linking in response to UV radiation with a wavelength in the range of 10-390 nm). For example, resist layer 230 may be a UV-curable adhesive film. In some embodiments, resist layer 230 may be curable by exposure to UV radiation with a wavelength in the range of 266-390 (e.g., a wavelength of 345-385 nm). Alternatively, resist layer 230 may be heat-curable. In other embodiments, resist layer 230 may be curable with heat, radiation, and/or pressure, in any combination.

At block 309, one or more openings may be formed through the resist layer to the electrical routing features. FIG. 4 depicts openings 228 in resist layer 230. In some embodiments, resist layer 230 may be a UV-curable negative resist or a UV-curable positive resist. In various embodiments, openings such as openings 228 may be formed through resist layer 230 by selectively exposing resist layer 230 to a source of UV light (e.g., a UV laser). In some embodiments, a photo mask (not shown) may be positioned between the UV light source and resist layer 230 to selectively expose desired portions of resist layer 230. In various embodiments, uncured portions of resist layer 230 may be subsequently removed (e.g., with an appropriate solvent) to obtain the desire pattern of openings 228.

In other embodiments, openings 228 may be formed through resist layer 230 by other known lithographic techniques, such as laser drilling. In still other embodiments, resist layer 230 may be a pre-patterned film with openings 228 pre-formed therein. Thus, in some embodiments block 309 may be omitted.

At block 311, interconnect structures may be formed within the openings of the resist layer. In various embodiments, openings 228 in resist layer 230 may be filled with a conductive material, such as solder. In some embodiments, the conductive material may comprise lead. In other embodiments, conductive material may comprise one or more of tin, silver, copper, bismuth, and/or other metals/semi-metals. In some embodiments, the conductive material may be deposited into openings 228 as a solder paste. In various embodiments, the conductive material may be reflowed by heating the conductive material to at least a melting temperature of the conductive material to form die interconnects 220 (see FIG. 2). Again, die interconnects 220 may have any suitable shape or configuration, such as rounded bumps, elongated bumps, pillars, and the like. In other embodiments, openings 228 may be filled/plated with an electrically conductive material (e.g., copper) to form die interconnects 220 and/or electrical routing features 206.

At block 313, a portion of the resist layer may be exposed to a laser light configured to cause crack formation within the resist layer and/or cracking or delamination between the resist layer and an adjacent structure (e.g., interconnect structure, underfill, electrical routing features. The parameters for exposure of the resist layer to laser light/radiation (e.g., energy density, beam size, and/or other characteristics) may vary among embodiments. For example, in various embodiments, the laser light the laser light may have an energy density in the range of 2-20 J/cm$^2$. In other embodiments, the laser light may have an energy density in the range of 2-5 J/cm$^2$, 5-10 J/cm$^2$, 10-15 J/cm$^2$, 15-20 J/cm$^2$, 2-10 J/cm$^2$, 12-20 J/cm$^2$, or 7-15 J/cm$^2$. In various embodiments, the laser light may have a surface area of 40 µm by 40 µm. In other embodiments, the laser light may have a surface area of 30-50 µm by 30-50 µm, 20-60 µm by 20-60 µm, 10-70 µm by 10-70 µm, or a diameter of 10-70 µm, 20-60 µm, 30-50 µm, 10-40 µm, or 30-60 µm. In some embodiments, the laser radiation may have a wavelength of 10-390 nm. In other embodiments, the laser radiation may have a wavelength of 740-3000 nm. In still other embodiments, the laser radiation may have a wavelength in the range of 390-740 nm.

Figure 5:
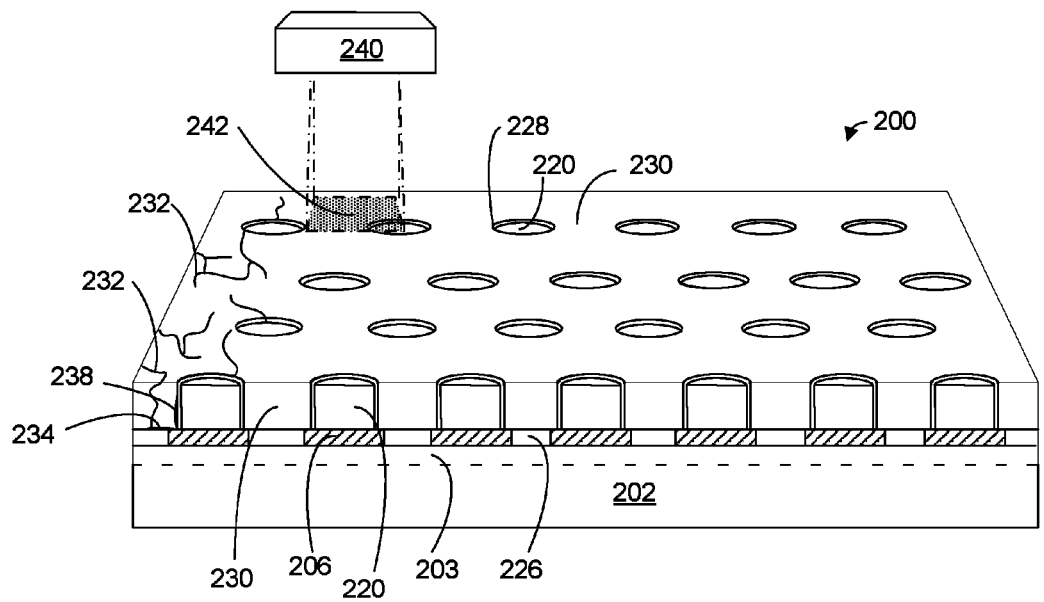
FIG. 5 schematically illustrates additional stages of package assembly fabrication, in accordance with various embodiments.

FIG. 5 depicts an example package assembly 200 at a corresponding stage of fabrication. Referring to FIG. 5, a laser radiation source 240 may be used to expose resist layer 230 to laser energy 242. While laser energy 242 is depicted as a polygonal beam in the illustrated example, it is to be understood that beam shape and other processing variables such as beam diameter, wavelength, intensity, fluence, pulse energy, and other factors may vary among embodiments, and may be adjusted to accommodate variations in the composition/thickness of resist layer 230, as well as the composition/thickness of die 202 and/or underfill layer 226.

Laser energy 242 may be configured to cause cracking and/or delamination of resist layer 230. FIG. 5 depicts the formation of cracks 232 in resist layer 230, as well as early stage delamination at an underfill-resist interface 234 and at an interconnect-resist interface 238. In some embodiments, delamination of resist layer 230 may be caused by localized heating and thermal expansion of the irradiated portion of resist layer 230. In some embodiments, resist layer 230 may have a coefficient of thermal expansion (CTE) that is different from that of an adjacent component (e.g., die interconnects 220, underfill layer 226, and/or electrical routing features 206). The difference in CTE between resist layer 230 and any or all of those components may cause resist layer 230 to expand at a faster or slower rate than an adjacent component, which may cause or enhance delamination of resist layer 230. In some embodiments, resist layer 230 and/or other components may be selected for use in a package assembly based at least in part on a CTE mismatch, in order to aid in later removal of resist layer 230.

In some embodiments, cracking of resist layer 230 may be caused by factors such as, but not limited to, localized heating, CTE mismatch with adjacent components, and disruption of the polymer matrix of resist layer 230 (e.g., disruption of cross-linking, polymer chain scission). In some embodiments, laser energy 242 may be provided at a power/fluence/intensity that is below a die damage threshold, but sufficient to induce or expedite decomposition/delamination of organic polymers, disrupt cross-linking within a polymer matrix, and/or remove polymer residues from one or more components of package assembly 200. In some embodiments, block 313 may be performed as a descum process. In various embodiments, exposing resist layer 230 to laser energy 242 may allow resist layer 230 to be removed from package assembly 200 without damaging die 202, electrical routing features 206, and/or other package assembly components.

Laser radiation source 240 may be any suitable laser. Suitable lasers include, but are not limited to, solid state pulsed lasers, pulsed metal vapor lasers, excimer lasers and continuous wave lasers with pulse modification, such as the commercially available Nd:YAG laser (wavelength 1064 nm), frequency-doubled Nd:YAG laser (wavelength 532 nm), frequency-tripled Nd:YAG laser (wavelength 355 nm), frequency-quadrupled Nd:YAG laser (wavelength 266 nm), argon gas lasers (wavelength 488 nm and 514.5 nm), high-performance diode lasers (800 to 1000 nm), ruby lasers (694 nm), F2 excimer lasers (157 nm), ArF excimer lasers (193 nm), KrCl excimer lasers (22 nm), KrF excimer lasers (248 nm), XeCl excimer lasers (308 nm), XeF excimer lasers (351 nm), CO2 lasers (10.6 μm), helium-neon gas lasers (543 nm, 632.8 nm, 1150 nm), krypton gas lasers (330 to 360 nm, 420 to 800 nm), hydrogen gas lasers (2600 to 3000 nm), and nitrogen gas lasers (337 nm). In some embodiments, laser energy 242 may have a wavelength of 355 nm. In other embodiments, laser energy 242 may have a wavelength of 266 nm.

Figure 6A:
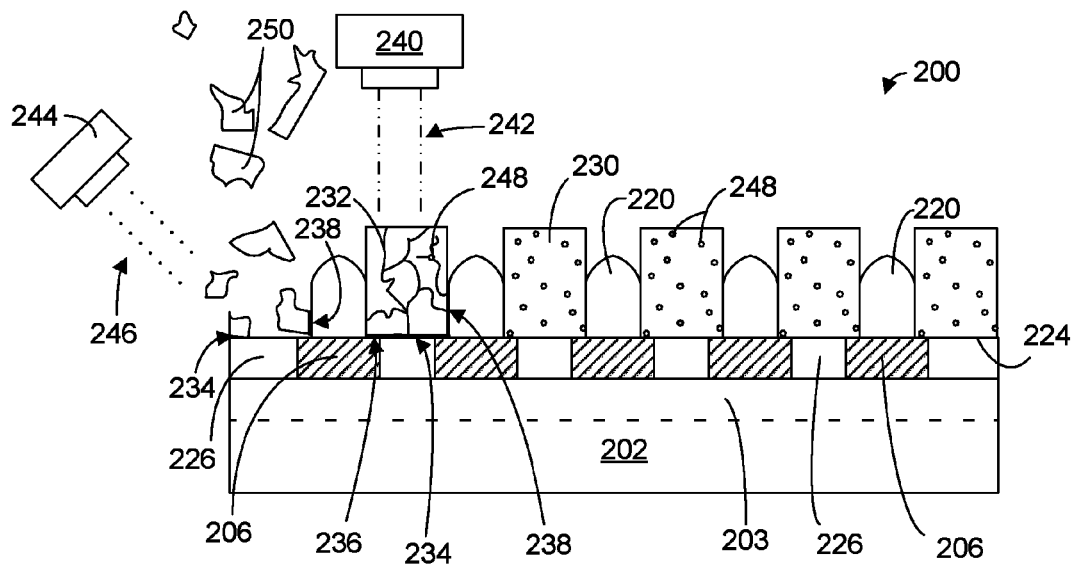
FIGS. 6a-c schematically illustrate additional stages of package assembly fabrication, in accordance with various embodiments.
Figure 6B:
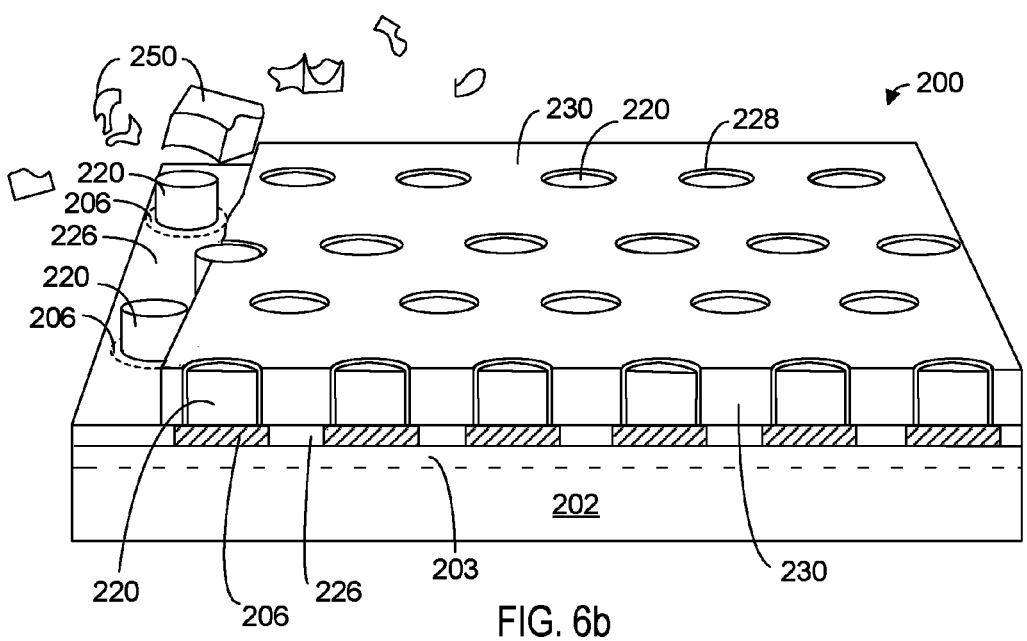
Figure 6C:
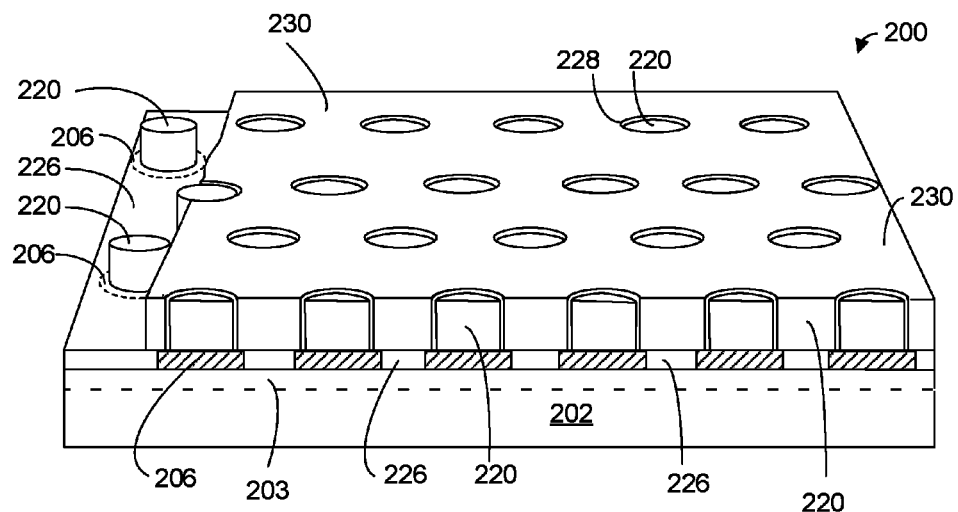
Figure 7:
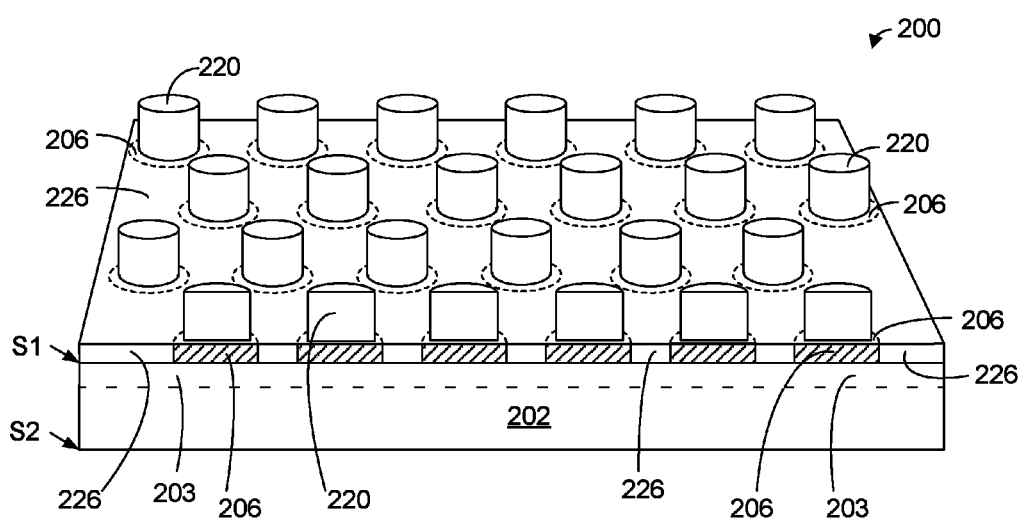
FIG. 7 schematically illustrates additional stages of package assembly fabrication, in accordance with some embodiments.

At block 315, a flow of a fluid may be applied to the exposed portion of the resist layer to separate the exposed portion from the die. FIGS. 6a and 6b illustrate an example package assembly 200 at a corresponding stage of fabrication. As depicted in FIG. 6a, laser radiation source 240 may be used to irradiate resist layer 230. A fluid source 244 may be used to apply a flow of fluid 246 to resist layer 230 to separate portions 250 of the resist layer 230 from adjacent structures (e.g., electrical routing features 206, die interconnects 220, and/or underfill layer 226). In some embodiments, fluid source 244 may be, or may include, a source of compressed gas, and fluid 246 may be a gas. In various embodiments, fluid 246 may be a gas that does not undergo a chemical reaction with die interconnects 220 and/or other materials of package assembly 200. In some embodiments, fluid 246 may be nitrogen, argon, helium, or some combination thereof. In other embodiments, fluid 246 may be ambient air delivered under pressure. In still other embodiments, fluid 246 may be a liquid, such as an aqueous solvent (e.g., water) or an organic solvent that is used primarily for mechanical, rather than chemical, disruption of resist layer 230. In other embodiments, removal of resist layer 230 does not involve application of a fluid or a subsequent wet cleaning process.

In some embodiments, as depicted for example in FIG. 6a, resist layer 230 may include a plurality of thermal expansion components 248. Thermal expansion components 248 may include, for example, filler particles, nanoparticles, metal oxides, and various additives configured to absorb laser energy. In other embodiments, thermal expansion components 248 may be small air bubbles or droplets of liquid encased/suspended in resist layer 230. Thermal expansion components 248 may have a coefficient of thermal expansion (CTE) that is greater than, or less than, a CTE of resist layer 230. In some embodiments, thermal expansion components 248 may be configured to absorb laser energy at a wavelength in the near infrared range (740 nm to 3000 nm), the visible range (390 nm to 740 nm), or the near ultraviolet range (150 nm to 389 nm). As a result, thermal expansion components 248 may respond to laser irradiation by expanding at a different rate (e.g., more quickly) than surrounding portions of resist layer 230. This CTE mismatch between thermal expansion components 248 and resist layer 230 may cause or enhance cracking within resist layer 230 and/or between resist layer 230 and adjacent surfaces (e.g., die interconnects 220, electrical routing features 206, underfill layer 226). As illustrated, delamination may occur at an interconnect-resist interface 238, at an electrical routing feature-resist interface 236, and/or at an underfill-resist interface 236.

Laser radiation source 240 and/or fluid source 244 may be applied to resist layer 230 in any suitable pattern of exposure/ number of passes. As depicted in FIG. 6b, as portions of resist layer 230 are removed, other features of package assembly 200 are exposed (e.g., electrical routing features 206, sides of die interconnects 220, underfill layer 226). Laser radiation source 240 and/or fluid source 244 may be applied to remaining portions of resist layer 230 to effect the removal of those remaining portions, as depicted for example in FIG. 7.

At block 317, a descum process may be performed to remove residue from one or more of the die, the interconnect structures, and the underfill layer. In some embodiments, the descum process may be a conventional process such as plasma ashing. In other embodiments, the descum process may be, or may include, additional irradiation and/or application of fluid to remove remaining polymer residues from the package assembly components. In some embodiments, block 317 may be omitted.

At block 319, the die may be coupled to a package substrate, such as package substrate 204 (FIG. 2). In some embodiments, die 202 and/or package assembly 200 may undergo further stages of fabrication in the same or similar manner as package assemblies subjected to a chemical removal of resist material. However, die 202 and/or package assembly 200 may have less or no chemical damage from resist stripping stages, in comparison to chemically treated dies/package assemblies.

Various operations are described as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired.

Figure 8:
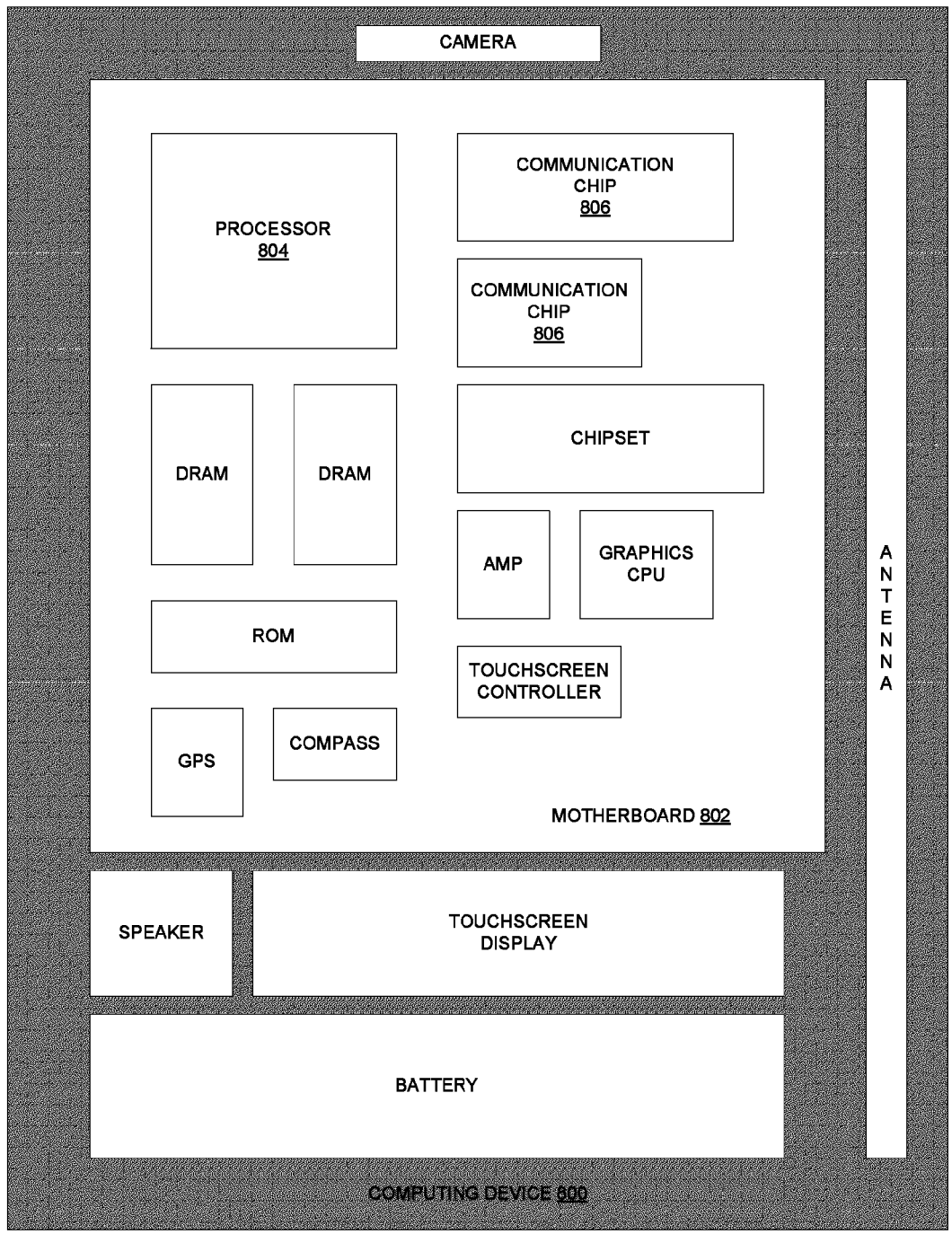
FIG. 8 schematically illustrates a computing device in accordance with various embodiments.

FIG. 8 illustrates an example computing device 800 that may include one or more components of a package assembly as describe herein (e.g., package assembly 200, die 202, electrical routing features 206, underfill layer 230, and/or die interconnects 220), in accordance with various embodiments. Components are numbered in this Figure without reference to the numbering scheme of FIGS. 1-7, and like numbers do not necessarily indicate corresponding components in prior Figures.

The computing device 800 may house a board such as motherboard 802. The motherboard 802 may include a number of components, including but not limited to a processor 804 and at least one communication chip 806. The processor 804 may be physically and electrically coupled to the motherboard 802 (e.g., circuit board 222 of FIG. 2). In some implementations, the at least one communication chip 806 may also be physically and electrically coupled to the motherboard 802. In further implementations, the communication chip 806 may be part of the processor 804.

The processor 804 of the computing device 800 may include a die (e.g., die 202 of FIG. 2) or package assembly (e.g., package assembly 200 of FIG. 2 or 4-7) as described herein. For example, the processor 804 may include a die (e.g., die 202 of FIG. 2) embodied in a package assembly (e.g., package assembly 200 of FIG. 2 or 4-7) that is mounted on the motherboard 802. The term "processor" may refer to any device or portion of a device that processes electronic data from registers and/or memory to transform that electronic data into other electronic data that may be stored in registers and/or memory.

The communication chip 806 may also include a die (e.g., die 202 of FIG. 2) embodied in a package assembly (e.g., package assembly 200 of FIG. 2 or 4-7). In further implementations, another component (e.g., memory device or other integrated circuit device) housed within the computing device 800 may include a die (e.g., die 202 of FIG. 2) embodied in a package assembly (e.g., package assembly 200 of FIG. 2 or 4-7).

Depending on its applications, computing device 800 may include other components that may or may not be physically and electrically coupled to the motherboard 802. These other components include, but are not limited to, volatile memory (e.g., dynamic random access memory, also referred to as "DRAM"), non-volatile memory (e.g., read only memory, also referred to as "ROM"), flash memory, an input/output controller, a digital signal processor (not shown), a crypto processor (not shown), a graphics processor, one or more antenna, a display (not shown), a touch screen display, a touch screen controller, a battery, an audio codec (not shown), a video codec (not shown), a global positioning system ("GPS") device, a compass, an accelerometer (not shown), a gyroscope (not shown), a speaker, a camera, and a mass storage device (such as hard disk drive, a solid state drive, compact disk ("CD"), digital versatile disk ("DVD"))(not shown), and so forth. In various embodiments, various components may be integrated with other components to form a System on Chip ("SoC"). In further embodiments, some components, such as DRAM, may be embedded in or within processor 804.

The communication chip(s) 806 may enable wired and/or wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 606 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 606 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 606 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 806 may operate in accordance with other wireless protocols in other embodiments.

The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

In various implementations, the computing device 800 may be a laptop, a netbook, a notebook, an ultrabook, a smart phone, a computing tablet, a personal digital assistant ("PDA"), an ultra mobile PC, a mobile phone, a desktop computer, a server, a printer, a scanner, a monitor, a set-top box, an entertainment control unit (e.g., a gaming console), a digital camera, a portable music player, or a digital video recorder. In further implementations, the computing device 800 may be any other electronic device that processes data.

EXAMPLES

In various embodiments, a method may comprise exposing a portion of a solder resist layer disposed on a die to a laser light, and applying a flow of fluid to the exposed portion of the solder resist layer to separate the exposed portion of the solder resist layer from the die. In various embodiments, the laser light may be configured to induce crack formation in the portion of the solder resist layer. In various embodiments, the die may be in wafer form. In various embodiments, the die may have an outer layer comprising an underfill material and one or more electrical routing features embedded therein. In various embodiments, the solder resist layer may be disposed on the underfill material and the one or more electrical routing features.

In various embodiments, the solder resist layer and the wafer assembly may have different coefficients of thermal expansion (CTEs). In various embodiments, the laser light may be configured to induce crack formation between the exposed portion of the solder resist layer and the die. In various embodiments, the die may comprise an interconnect structure disposed in an opening in the exposed portion of the solder resist layer, and the laser light may be configured to induce crack formation between the exposed portion of the solder resist layer and the interconnect structure. In various embodiments, the solder resist layer and the solder bump may have different coefficients of thermal expansion (CTEs).

In various embodiments, the flow of fluid may be a flow of gas. In various embodiments, the gas may be an inert gas. In various embodiments, exposing a portion of a solder resist layer may comprise scanning the solder resist layer with the laser light. In various embodiments, the laser light may be emitted by an ultra-fast laser. In various embodiments, the ultra-fast laser may be a "short pulse" laser that emits short or ultra-short pulses (e.g., pulses with a duration in the picosecond or femtosecond ranges). In some embodiments, the short pulse laser may be a CO2 laser or an ultraviolet (UV) laser. In various embodiments, the solder resist layer may comprise one or more thermal expansion components configured to expand in response to heating by exposing the portion of the solder resist layer to the laser light. In various embodiments, the solder resist layer may comprise a polymer matrix having the thermal expansion components dispersed therein. In various embodiments, the thermal expansion components may be configured to expand at a different rate than the polymer matrix in response to the heating.

In various embodiments, a method may comprise forming a resist layer on a die, forming interconnect structures on the electrical routing features, exposing a portion of the resist layer to a laser light, and applying a flow of fluid to the exposed portion of the resist layer to separate the exposed portion of the resist layer from the die at the interface. In various embodiments, the die may comprise a first surface with a plurality of electrical routing features. In various embodiments, the interconnect structures may be disposed through the resist layer. In various embodiments, the laser light may be configured to cause crack formation at an interface between the resist layer and the die. In various embodiments, the die may be in wafer form.

In various embodiments, the die may have an outer layer comprising an underfill material and one or more electrical routing features embedded therein. In various embodiments, the resist layer may be disposed on the underfill material and the one or more electrical routing features. In various embodiments, exposing the portion of the resist layer to the laser light and applying the flow of fluid against the resist layer may be performed concurrently. In various embodiments, forming interconnect structures on the electrical routing features may comprise forming a plurality of openings in the resist layer, placing solder paste into the openings, and heating the solder paste within the openings. In various embodiments, the plurality of openings may be positioned to expose the electrical routing features.

In various embodiments, the resist layer and the interconnect structures may have different coefficients of thermal expansion (CTEs). In various embodiments, the laser light may be configured to induce crack formation between the resist layer and one or more of the interconnect structures. In various embodiments, the flow of fluid may be a flow of gas. In various embodiments, the gas may be an inert gas. In various embodiments, the laser light may be emitted by a short pulse laser. In various embodiments, the short pulse laser may be a CO2 laser or a UV laser. In various embodiments, the resist layer may comprise one or more thermal expansion elements configured to expand in response to heating. In various embodiments, the resist layer may comprise a polymer matrix with the thermal expansion components dispersed therein. In various embodiments, the thermal expansion components may be configured to expand at a different rate than the polymer matrix in response to heating by exposing the portion of the resist layer to the laser light. In various embodiments, at least some of the thermal expansion components may be disposed at the interface between the solder resist layer and the die.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A method comprising:
    exposing a portion of a solder resist layer disposed on a die to a laser light, wherein the laser light is configured to induce crack formation in the portion of the solder resist layer; and
    applying a flow of fluid to the exposed portion of the solder resist layer to separate the exposed portion of the solder resist layer from the die,
        wherein the solder resist layer comprises one or more thermal expansion components configured to expand in response to heating by exposing the portion of the solder resist layer to the laser light, and
        wherein the solder resist layer comprises a polymer matrix having the one or more thermal expansion components dispersed therein, and the one or more thermal expansion components are configured to expand at a different rate than the polymer matrix in response to the heating.

2. The method of claim 1, wherein the die is in wafer form.

3. The method of claim 1, wherein the die has an outer layer comprising an underfill material and one or more electrical routing features embedded therein, and wherein the solder resist layer is disposed on the underfill material and the one or more electrical routing features.

4. The method of claim 1, wherein the solder resist layer and the wafer assembly have different coefficients of thermal expansion (CTEs), and wherein the laser light is configured to induce crack formation between the exposed portion of the solder resist layer and the die.

5. The method of claim 1, wherein:
    the die comprises an interconnect structure disposed in an opening in the exposed portion of the solder resist layer;
    the solder resist layer and the solder bump have different coefficients of thermal expansion (CTEs); and
    the laser light is configured to induce crack formation between the exposed portion of the solder resist layer and the interconnect structure.

6. The method of claim 1, wherein the flow of fluid is a flow of gas.

7. The method of claim 6, wherein the gas is an inert gas.

8. The method of claim 1, wherein exposing a portion of a solder resist layer comprises scanning the solder resist layer with the laser light.

9. The method of claim 1, wherein the solder resist layer is configured to absorb laser energy in a range of wavelengths, and the laser light is emitted by a short pulse laser configured to emit a wavelength of light within said range of wavelengths.

10. The method of claim 9, wherein the short pulse laser is a CO2 laser or an ultraviolet (UV) laser.

11. A method comprising:
    forming a resist layer on a die, wherein the die comprises a first surface with a plurality of electrical routing features;
    forming interconnect structures on the electrical routing features, the interconnect structures disposed through the resist layer;
    exposing a portion of the resist layer to a laser light, wherein the laser light is configured to cause crack formation at an interface between the resist layer and the die; and
    applying a flow of fluid to the exposed portion of the resist layer to separate the exposed portion of the resist layer from the die at the interface,
        wherein the resist layer comprises one or more thermal expansion elements configured to expand in response to heating, and
        wherein the resist layer comprises a polymer matrix with the one or more thermal expansion components dispersed therein, and the one or more thermal expansion components are configured to expand at a different rate than the polymer matrix in response to heating by exposing the portion of the resist layer to the laser light.

12. The method of claim 11, wherein the die is in wafer form.

13. The method of claim 11, wherein the die has an outer layer comprising an underfill material and one or more electrical routing features embedded therein, and wherein the resist layer is disposed on the underfill material and the one or more electrical routing features.

14. The method of claim 11, wherein exposing the portion of the resist layer to the laser light and applying the flow of fluid against the resist layer are performed concurrently.

15. The method of claim 11, wherein forming interconnect structures on the electrical routing features comprises:
   forming a plurality of openings in the resist layer, the plurality of openings positioned to expose the electrical routing features;
   placing solder paste into the openings; and
   heating the solder paste within the openings.

16. The method of claim 11, wherein the resist layer and the interconnect structures have different coefficients of thermal expansion (CTEs), and the laser light is configured to induce crack formation between the resist layer and one or more of the interconnect structures.

17. The method of claim 11, wherein the flow of fluid is a flow of gas.

18. The method of claim 17, wherein the gas is an inert gas.

19. The method of claim 11, wherein the laser light is emitted by an ultra-fast laser.

20. The method of claim 19, wherein the ultra-fast laser is a CO2 laser or a UV laser.

21. The method of claim 11, wherein at least some of the one or more thermal expansion components are disposed at the interface between the resist layer and the die.

* * * * *